United States Patent [19]
Nakamura et al.

[11] Patent Number: 6,128,212
[45] Date of Patent: Oct. 3, 2000

[54] METAL FERROELECTRIC SILICON FIELD EFFECT TRANSISTOR MEMORY

[75] Inventors: Takashi Nakamura; Yuichi Nakao, both of Kyoto, Japan

[73] Assignee: Rhohm Co., LTD, Kyoto, Japan

[21] Appl. No.: 09/069,214

[22] Filed: Apr. 29, 1998

Related U.S. Application Data

[62] Division of application No. 08/715,967, Sep. 19, 1996, Pat. No. 5,768,185, which is a continuation of application No. 08/363,881, Dec. 27, 1994, abandoned.

[30] Foreign Application Priority Data

Dec. 28, 1993 [JP] Japan ................................ 5-336337

[51] Int. Cl.⁷ .................................................. G11C 11/22
[52] U.S. Cl. ...................... 365/145; 365/185.01; 327/295
[58] Field of Search ............................. 365/145, 185.01, 365/129; 257/295

[56] References Cited

U.S. PATENT DOCUMENTS

| | | | |
|---|---|---|---|
| 4,630,086 | 12/1986 | Sato ........................................ | 365/185 |
| 4,888,630 | 12/1989 | Paterson ................................. | 365/185 |
| 5,293,510 | 3/1994 | Takenaka ................................ | 365/145 |
| 5,303,182 | 4/1994 | Nakao et al. .......................... | 365/145 |
| 5,309,392 | 5/1994 | Oltsuka et al. ........................ | 365/154 |
| 5,345,415 | 9/1994 | Nakao .................................... | 365/145 |
| 5,498,888 | 3/1996 | Ozawa .................................... | 257/295 |
| 5,508,953 | 4/1996 | Fukuda et al. ......................... | 365/154 |
| 5,559,733 | 9/1996 | McMillan et al. ..................... | 365/154 |

*Primary Examiner*—David Nelms
*Assistant Examiner*—Hoai V. Ho
*Attorney, Agent, or Firm*—Arent Fox Kintner Plotkin & Kahn, PLLC

[57] ABSTRACT

On the surface of a semiconductor substrate between a source region and a drain region formed on the semiconductor substrate, an insulating layer, a conductive thin film used as a floating electrode, a ferroelectric thin film and a conductive thin film used as a control electrode are successively formed. Writing or erasing is performed by causing a potential difference between the control electrode and the semiconductor substrate to reverse the polarization of the ferroelectric thin film.

3 Claims, 7 Drawing Sheets

METAL FERROELECTRIC SILICON FIELD EFFECT TRANSISTOR MEMORY

This application is a Divisional Application of application Ser. No. 08/715,967 filed Sep. 19, 1996, now U.S. Pat. No. 5,768,185 which is a continuation of application Ser. No. 08/363,881 filed Dec. 27, 1994, now abandoned.

BACKGROUND OF THE INVENTION

1. Field of the Invention

The present invention relates to a non-volatile semiconductor memory, and more particularly, to a memory of a metal ferroelectric silicon (MFS) field effect transistor type.

2. Description of the Prior Art

A conventional MFS field effect transistor (FET) of this type is of a structure as shown in FIG. 1 where a ferroelectric thin film 103 is directly formed on a silicon substrate 100 between a source region 101 and a drain region 102 formed in the substrate 100, and a metallic thin film 104 is provided on the ferroelectric thin film 103.

However, this structure creates the following problems: First, since there are no ferroelectric substances having a lattice constant which is matched with that of silicon, the mismatch between the lattice constant of the silicone substrate 100 and that of the ferroelectric film 103 is large, so that a ferroelectric thin film having an excellent crystallizing capability cannot be formed. In addition, since mainly used ferroelectric substance is an oxide, an unnecessary film such as an $SiO_2$ film having a low dielectric constant is formed between the substrate 100 and the ferroelectric thin film 101 when the film 101 is formed (600° C.). This unnecessary film deteriorates the film quality, increases the operating voltage and increases the trap level. The increase in operating voltage is caused because it is necessary for the operating voltage to be increased since the electrical field is applied mostly to the low-dielectric-constant $SiO_2$ film (the unnecessary film) and barely to the ferroelectric thin film 103 when a voltage is applied. The increase in trap level is caused because a charge is applied to the unnecessary film to countervail the polarization of the ferroelectric substance.

Moreover, in the above-described conventional semiconductor memory, the elements composing the ferroelectric thin film 103 are dispersed in the substrate 100 to break the balance of the charge in the channel portion, so that a desired FET characteristic cannot be obtained. For these reasons, an MFS FET device using the conventional memory has not been put into practical use. Further, in the conventional semiconductor memory, as shown in FIG. 2, two selector transistors 106 and 107 are necessary for reading and writing for every MFS FET 105, so that the area of a memory cell 108 increases.

SUMMARY OF THE INVENTION

An object of the present invention is to provide a non-volatile semiconductor memory where the crystallizing capability of the ferroelectric thin film is excellent, the film quality never deteriorates and the area of the memory cell is small.

A non-volatile semiconductor memory of the present invention is provided with the following: a semiconductor substrate; a source region formed in the semiconductor substrate; a drain region formed in the semiconductor substrate; an insulating film formed on a surface of the semiconductor substrate between the source and drain regions; a conductive thin film for use as a floating electrode formed on the insulating film; a ferroelectric thin film formed on the conductive thin film for use as a floating electrode; and a conductive thin film for use as a control electrode formed on the ferroelectric thin film.

According to such features, by providing a gate insulating film, a floating gate can be provided thereon, and by constituting the floating gate by a film excellently matching with the ferroelectric thin film, the ferroelectric film can be used as a growing surface, so that a ferroelectric film having an excellent crystallizing capability is obtained.

Moreover, in this memory device, when a high bias voltage is applied, a sufficient electrical field is applied to the ferroelectric thin film, so that the polarization of the ferroelectric substance is reversed. When a low vias voltage is applied, the electrical field is not sufficiently applied to the ferroelectric thin film, so that the polarization of the ferroelectric substance is not reversed and the electrical field is applied only to the gate insulating film. Thus, writing and erasing can be performed by applying a high voltage, and reading is performed by applying a low voltage.

BRIEF DESCRIPTION OF THE DRAWINGS

This and other objects and features of this invention will become clear from the following description, taken in conjunction with the preferred embodiments with reference to the accompanied drawings in which.

DESCRIPTION OF THE PREFERRED EMBODIMENTS

Figure 1:
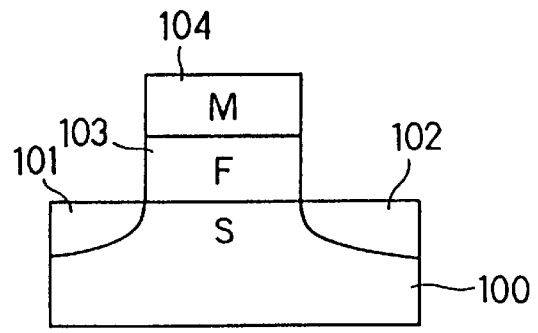
FIG. 1 is a schematic view of the structure of a conventional non-volatile semiconductor memory.
Figure 2:
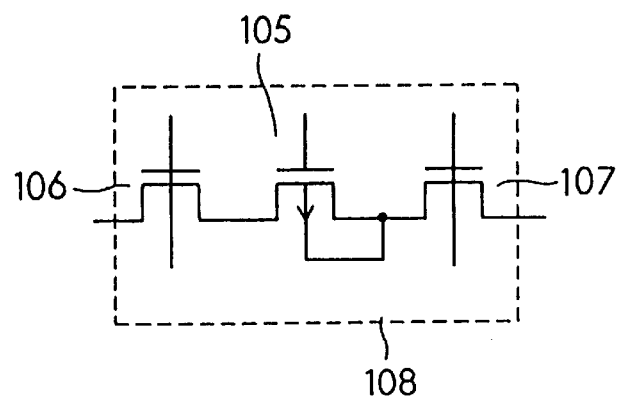
FIG. 2 is a circuit diagram of a memory cell using the conventional memory device.
Figure 3:
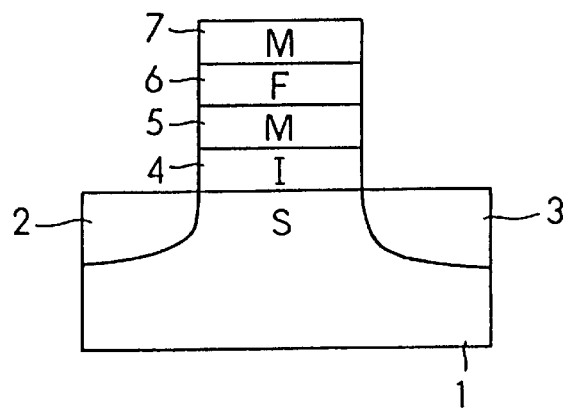
FIG. 3 is a schematic view of the structure of a non-volatile semiconductor memory device embodying the present invention.

Hereinafter, an embodiment of the present invention will be described with reference to the drawings. Referring to FIG. 3, there is shown an embodiment of a memory transistor constituted as an N-channel FET. Reference numeral 1 represents a P-type silicon substrate. Reference numeral 2 represents an N-type source region. Reference numeral 3 represents an N-type drain region. Reference numeral 4 represents a gate insulating film formed on the substrate between the source region 2 and the drain region 3. Reference numeral 5 represents a floating gate constituted by a conductive thin film. Reference numeral 6 represents a ferroelectric thin film. Reference numeral 7 represents a control electrode constituted by a conductive thin film.

The gate insulating film 4 is made of $SiO_2$. By providing the gate insulating film 4, a metal such as platinum (Pt)

having a lattice constant which excellently matches with the ferroelectric thin film 6 can be used as the floating gate 5. Since the ferroelectric thin film 106 is formed with the lattice constant which excellently matches platinum as the growing surface, an excellent crystallizing capability is obtained.

Moreover, in this embodiment, the floating gate 5, the insulating film 4 and the substrate 1 constitute a metal oxide semiconductor (MOS) structure, so that these elements can be formed by a general MOS producing technology and the ferroelectric thin film 6 and the control electrode 7 are formed thereon. Thus, the manufacture of this embodiment is easy. While it is desirable to use platinum as the floating gate 5 as described above, since the contacting capability and the barrier capability (dispersion preventing capability) are slightly inferior when only platinum is used, the floating gate 5 may be a laminated structure constituted by layers of platinum and another metal to improve the contacting capability and the barrier capability. Two-layer structures of such as Pt and Ti, Pt and Ta, and Pt and TiN are examples of such a laminated structure. Non-metal such as $RuO_2$ may be used similarly to Ti, Ta and TiN as far as it has conductivity.

While $SiO_2$ is the most desirable as the material for the gate insulating film 4, an insulator such as $CaF_2$ and MgO may be used as far as it excellently matches with the semiconductor substrate.

Figure 4A:
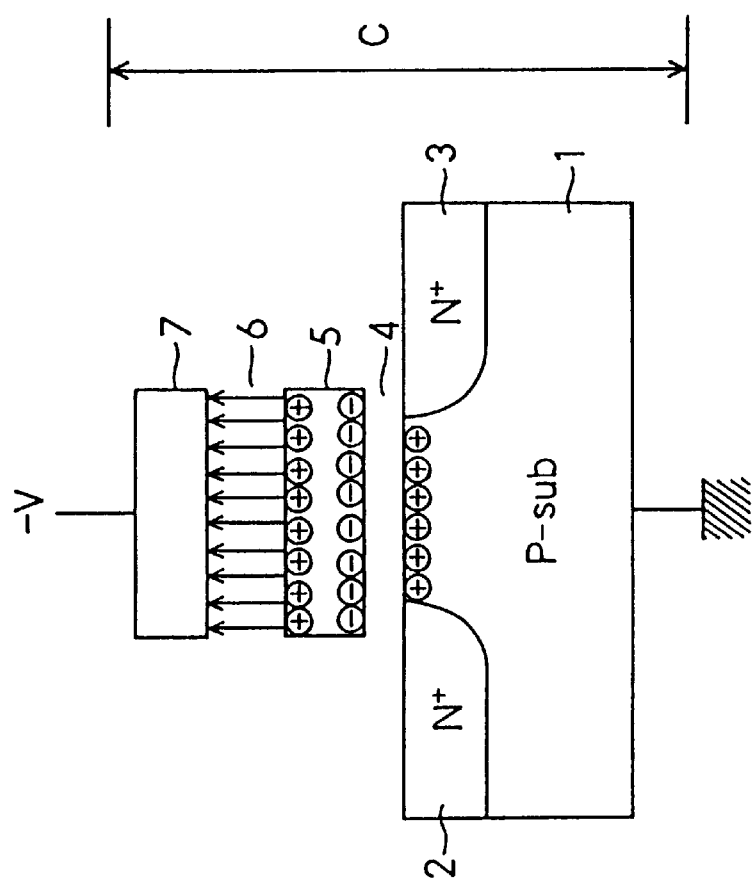
FIGS. 4A and 4B show the operation of the memory of FIG. 3.
Figure 4B:
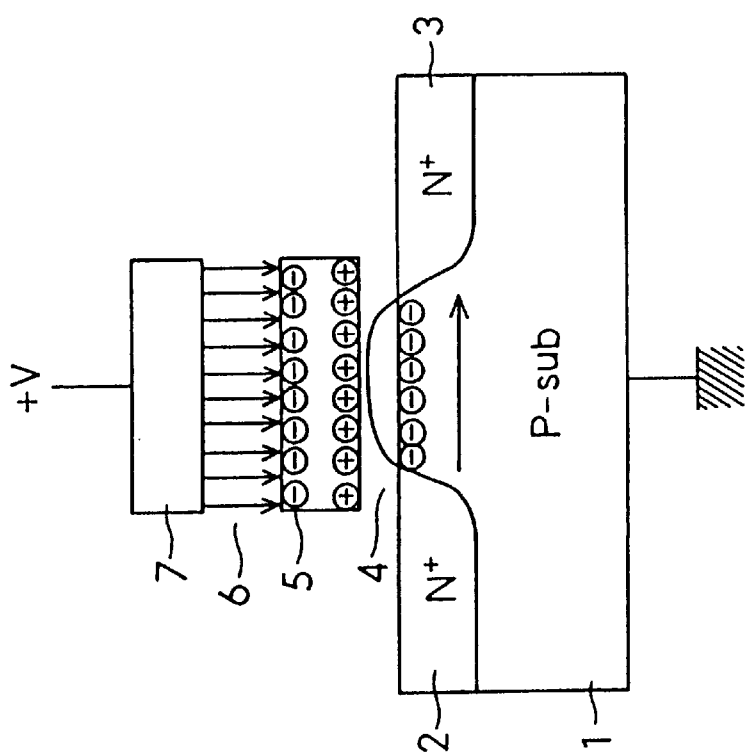

Referring to FIGS. 4A and 4B, there are shown the activated condition (FIG. 4A) and the disabled condition (FIG. 4B) of a transistor of the above-described structure. To activate the transistor, a positive voltage +V is applied to the control electrode 7. The voltage +V is a voltage sufficient for the polarization of the ferroelectric thin film 6 to be reversed. By the reversal of the polarization at the ferroelectric thin film 6, a negative charge is accumulated in the floating gate 5. In accordance therewith, a positive charge which works to countervail the negative charge is generated on the upper surface of the gate insulating film 4.

To countervail the positive charge, a negative charge is generated on the surface of the substrate 1. If a voltage of a value higher than a value at which the negative charge serves as a depletion layer has been applied to the control electrode 7, an inversion layer is formed to activate the FET. When a negative voltage –V is applied to the control electrode 7, a positive charge is generated on the surface of the substrate 1 as shown in FIG. 4B by the same working as that shown in FIG. 4A, so that the FET is disabled. In either case, the substrate 1 is connected to ground.

Figure 5:
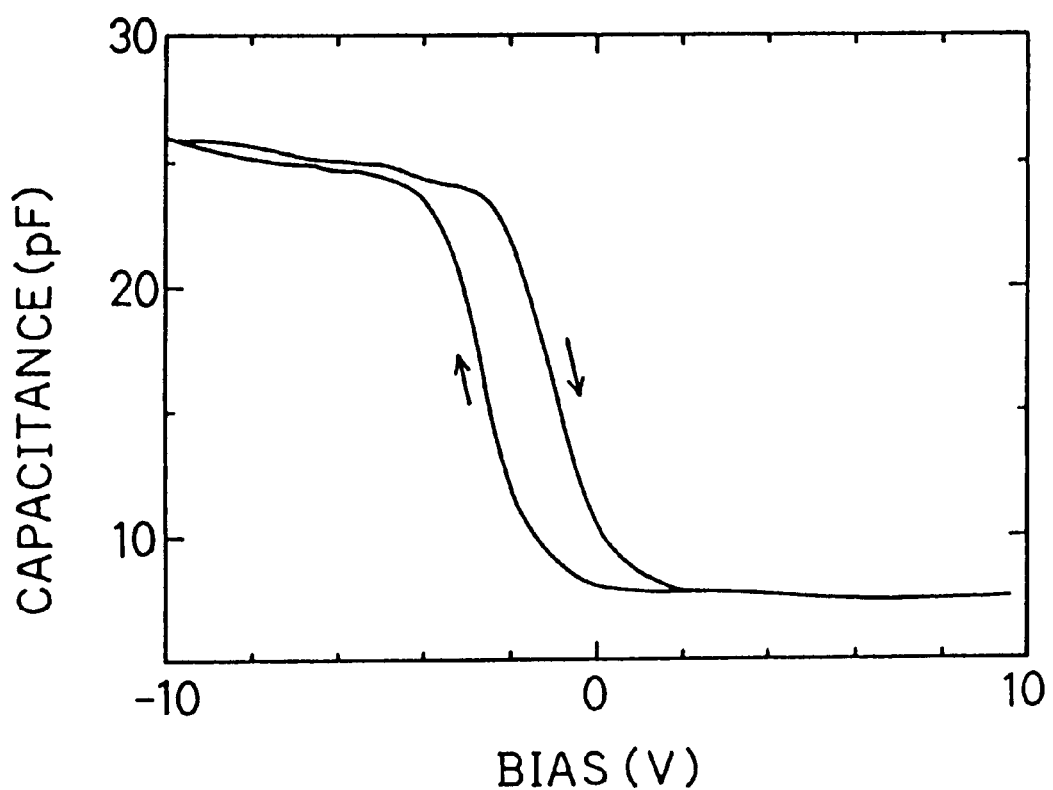
FIG. 5 shows a bias voltage to capacitance characteristic of the memory device of FIG. 3.

Referring to FIG. 5, there is shown a capacitance C (see FIGS. 4A and 4B) to bias voltage V characteristic taken between the control electrode 7 and the substrate 1. In normal MOS transistors, when the bias is changed from negative to positive and then returned from positive to negative, the characteristic curves of the capacitance C and the bias are the same, whereas in the FET of this embodiment, the characteristic curve is a hysteresis curve as shown in the figure. This is attributed to the fact that the density of the charge is different between when the voltage is changed from negative to positive and when it is changed from positive to negative.

With respect to the characteristic of FIG. 5, the applied voltage V is ±10V, and PZT ($PbZr_xTi_{1-x}O_3$) is used as the material of the ferroelectric thin film 6. The same result is obtained when PbTio or $Bi_4Ti_3O_{12}$ is used instead of PZT. The writing voltage can be controlled by controlling the dielectric constant and the thickness of the ferroelectric thin film 6. While the ferroelectric thin film 6 is formed by the Sol-Gel method in this embodiment, the sputtering method, the chemical vapor deposition (CVD) method and the molecular beam epitaxy (MBE) method may be used.

Figure 6B:
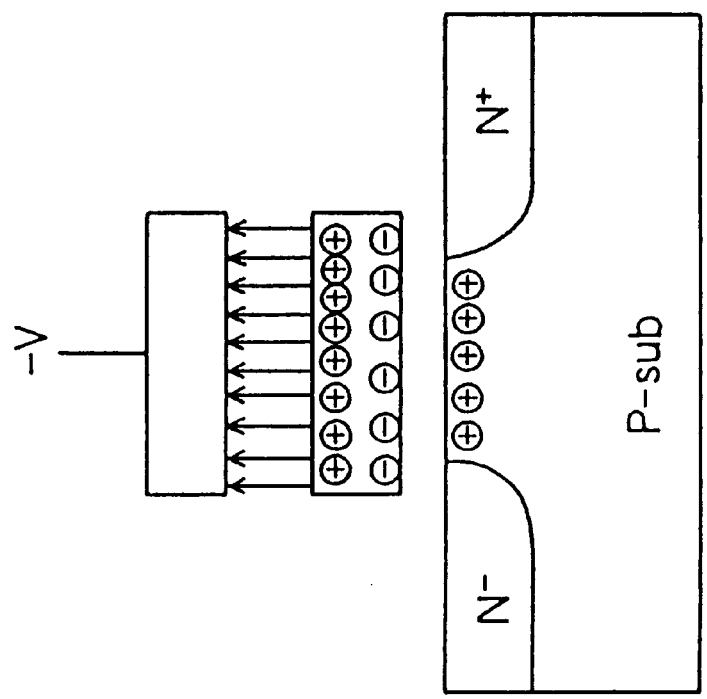
FIGS. 6A and 6B show the operation of a P-channel memory device FET.
Figure 6A:
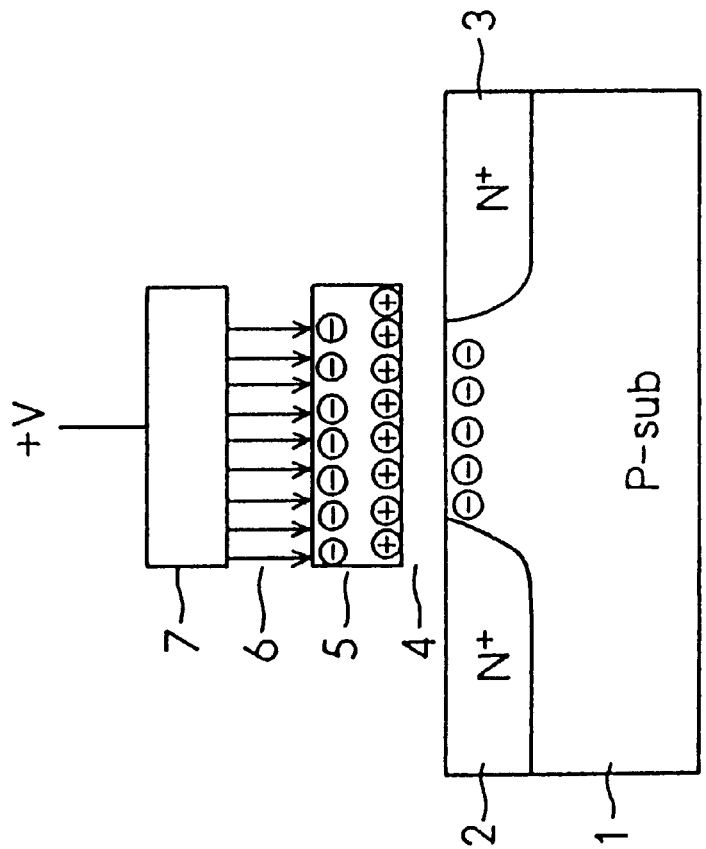

Referring to FIGS. 6A and 6B, there are shown the disabled condition (FIG. 6A) and the activated condition (FIG. 6B) of a P-channel FET. In this case, the substrate 1 is also connected to ground. The P-channel FET is different from the N-channel FET of FIGS. 4A and 4B in that it is disabled when a positive voltage is applied to the control electrode 7 and activated when a negative voltage is applied thereto.

The writing and reading of data are performed in the following manner in both the N-channel and P-channel FETs. In the memory device of this embodiment, when a high bias voltage is applied, an electrical field is applied to the ferroelectric thin film 6 to cause polarization. However, when a low bias voltage is applied, not much electrical field is applied to the ferroelectric thin film 6, so that no polarization is caused and the electrical field is applied only to the gate insulating film 4. For this reason, a high bias voltage is applied in writing and a low bias voltage is applied in reading.

Figure 7:
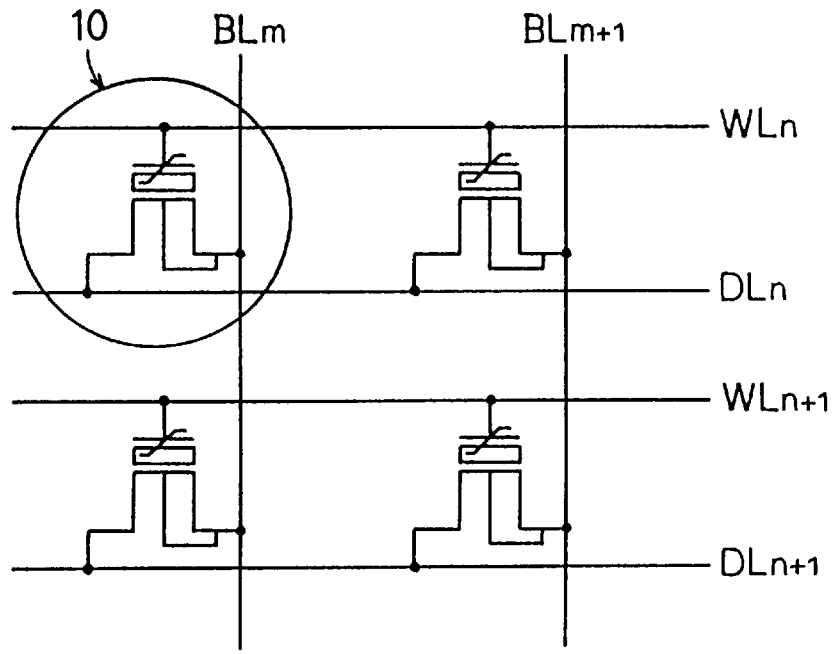
FIG. 7 shows a part of a memory circuit.

Referring to FIG. 7, there is shown an embodiment of a memory circuit using the above-described memory device. The memory device (FET) constituting the circuit is an enhancement type (normally OFF) which is disabled when the gate voltage (voltage applied to the control electrode 7) is 0V both in the written condition "1" and in the not written condition "0". Whether the condition is "1" or "0" is determined by reading a variation in threshold voltage $V_{th}$ due to the polarization at the ferroelectric thin film 6. The memory device (FET) of FIG. 7 is of P-channel type.

Referring to Table 1, there is shown an example of the operation method of this circuit. The operation will be described with reference to Table. 1. Assuming that a memory cell (m, n) enclosed by a circle 10 in FIG. 7 is the selected cell, the writing, erasing and reading of data will be described with respect to the cell. $BL_m$ and $BL_{m+1}$ represent bit lines. $WL_n$ and $WL_{n+1}$ represent word lines. $DL_n$ and $DL_{n+1}$ represent drive lines.

(1) Writing

To write to the selected cell (m, n), a writing voltage (+V=high) is applied to the bit line $BL_m$. This voltage is approximately 10V which is sufficient to cause the reversal of polarization at the ferroelectric thin film 6. The level of the word line $WL_n$ connected to the selected cell is changed to the ground level (a voltage of 0V). At this time, the other word line $WL_{n+1}$ is opened in order that writing is not performed to un-selected cells.

(2) Erasing

An operation opposite to the writing operation is performed. An erasing voltage (+$V_1$=high) is applied to the word line $WL_n$, and the level of the bit line $BL_m$ is changed to the ground level. At this time, the voltage +$V_1$ is applied to the other bit line $BL_{m+1}$ in order that the data in un-selected cells are not erased and the other word line $WL_{+1}$ is opened.

(3) Reading

A reading voltage SV is applied to the word line $WL_n$. This voltage is a voltage between the threshold voltage Vth in the "1" condition of the FET and the threshold voltage Vth in the "0" condition of the FET which voltage does not cause the reversal of polarization at the ferroelectric thin film 6. For example, this voltage may be approximately 3V to 5V. When the level of the bit line $BL_m$ is changed to the ground level and a sensing current SA is flowed through the drive line $DL_n$, a current flows through the bit line $B_m$ if the selected cell (m, n) is in the written condition.

Figure 8:
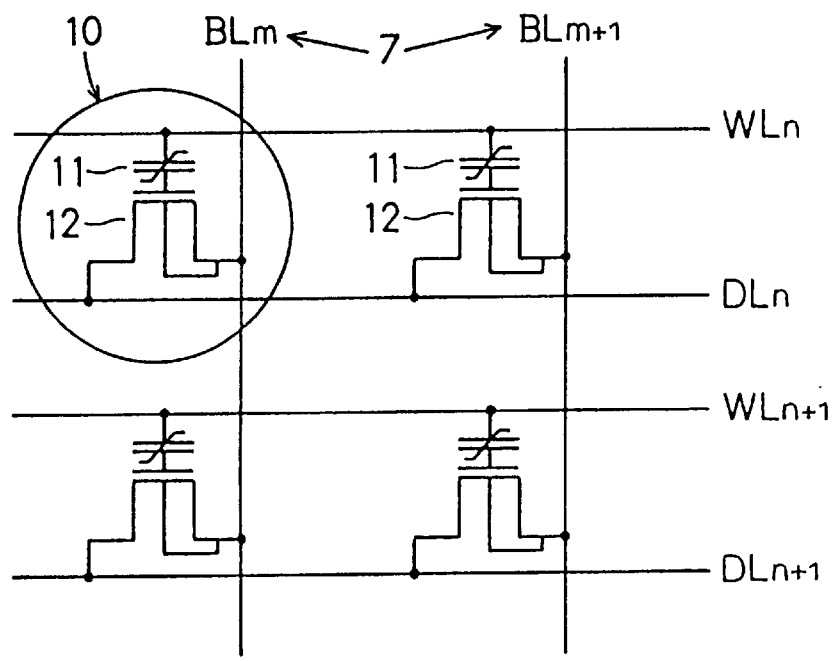
FIG. 8 shows a memory circuit using a memory device of another embodiment of the present invention.

While in FIG. 7, the memory device includes only a transistor having the floating gate 5 shown in FIGS. 6A and 6B, the writing, erasing and reading can also be performed by the method as shown in Table 1 when a ferroelectric capacitor 11 connected to the gate of a MOSFET 12 is used as the memory cell as shown in FIG. 8.

Figure 9:
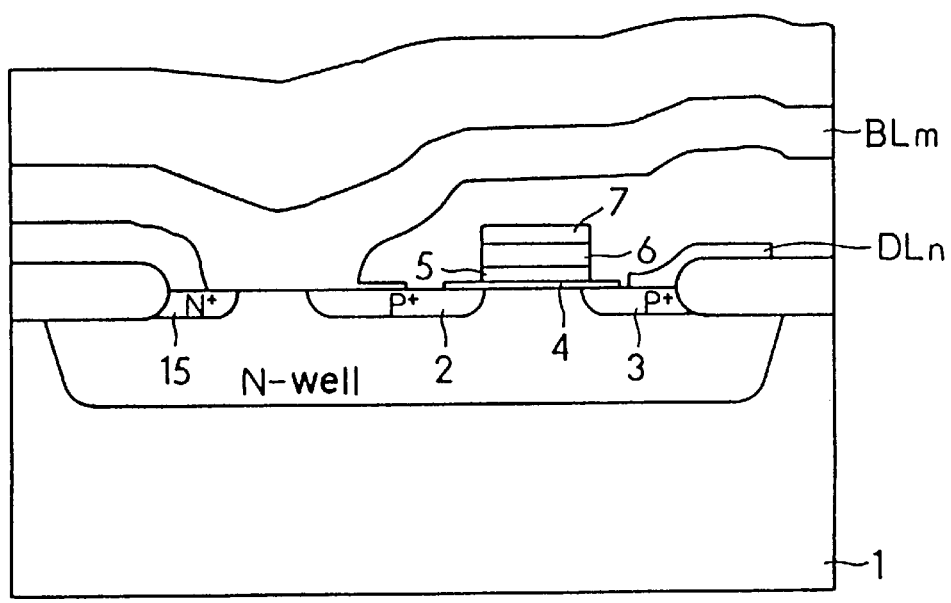
FIG. 9 shows the cross-sectional structure of a memory cell of the circuit of FIG. 8.
Figure 10:
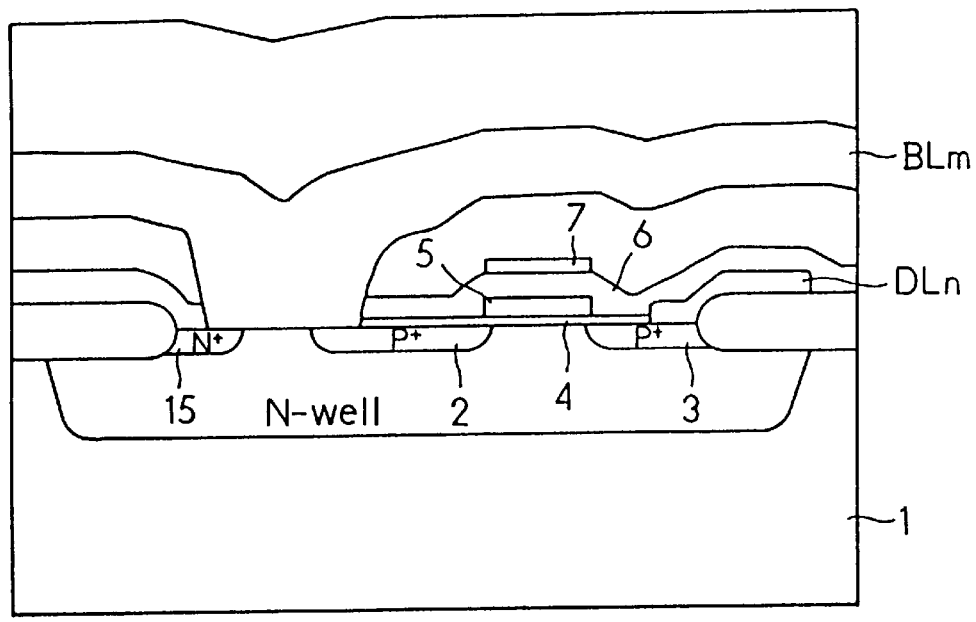
FIG. 10 shows the cross-sectional structure of a memory cell of another embodiment.
Figure 11:
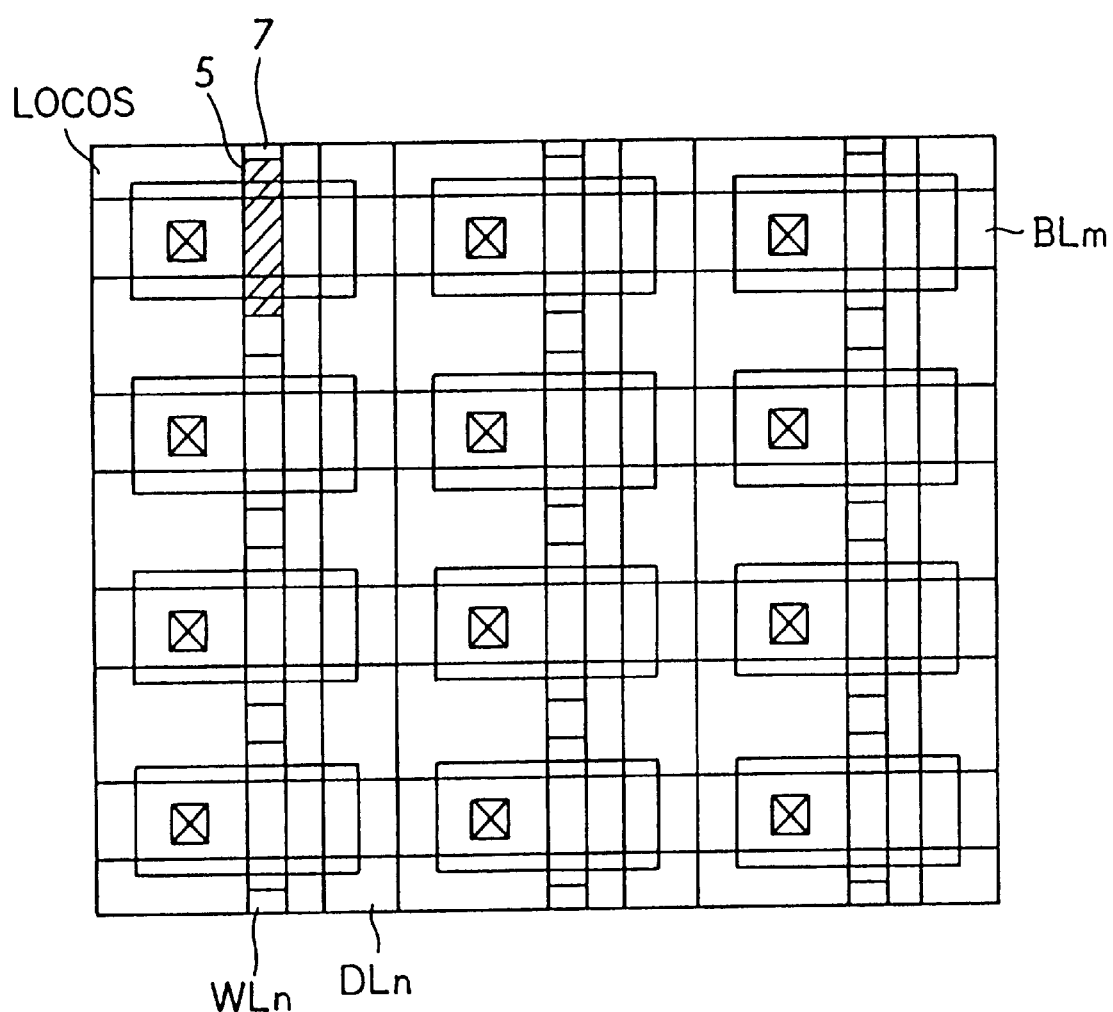
FIG. 11 is a plan layout view.

Referring to FIG. 9, there is shown the cross-sectional structure of the memory cell. The bit line $BL_m$ is short-circuited with the source region 2 of the FET. As the word line $WL_n$, the control electrode 7 is used. The drive line $DL_n$ is arranged so as to be directly in contact with the drain region 3. While an $N^+$ layer 15 is formed at a portion where an N well and the bit line $BL_m$ are in contact, the $N^+$ layer may be deleted if a contact having a sufficiently small resistance can be formed. FIG. 10 shows that it is unnecessary to process the ferroelectric thin film 6. FIG. 11 is a plan layout view. In FIGS. 9 to 11, the same elements are identified by the same reference designations.

As described above, according to the present invention, by providing the gate insulating film, the floating gate can be provided thereon, and by constituting the floating gate by a film having a lattice instant excellently matching with the ferroelectric thin film, the ferroelectric film can be used as a growing surface, so that a ferroelectric film having an excellent crystallizing capability is obtained. Moreover, in the memory of the present invention, writing and erasing are performed by applying a high voltage and reading is performed by applying a low voltage, so that no selector transistors are necessary. As a result, the area of the chip as the cell decreases.

Obviously, many modifications and variations of the present invention are possible in light of the above teachings. It is therefore to be understood that within the scope of the appended claims, the invention may be practiced other than as specifically described.

TABLE 1

|  | $WL_n$ | $WL_{n+1}$ | $BL_m$ | $BL_{m+1}$ | $DL_n$ | $DL_{n+1}$ |
| --- | --- | --- | --- | --- | --- | --- |
| Write | 0 | open | high | 0 | 0 | 0 |
| Read | Sv | 0 | 0 | 0 | SA | 0 |
| Erase | high | open | 0 | high | 0 | 0 |

What is claimed is:

1. A non-volatile semiconductor memory, comprising:
   a semiconductor substrate;
   a source region formed in the semiconductor substrate;
   a drain region formed in the semiconductor substrate;
   an insulating film formed on a surface of the semiconductor substrate between the source and drain regions;
   a first conductive thin film for use as a floating electrode formed on the insulating film;
   a ferroelectric thin film formed on the first conductive thin film;
   a second conductive thin film for use as a control electrode formed on the ferroelectric thin film;
   a first conductive line in contact with the drain region; and
   wherein said ferroelectric thin film is continuously formed on the first conductive thin film so as to cover at least part of the insulating film.

2. The non-volatile semiconductor memory according to claim 1, further comprising:
   a second conductive line in contact with the source region,
   wherein said second conductive line is disposed over the second conductive thin film and the first conductive line.

3. The non-volatile semiconductor memory according to claim 1, wherein said ferroelectric thin film is continuously formed over both the first conductive thin film and the first conductive line.

* * * * *